United States Patent
Wakamatsu et al.

(10) Patent No.: US 8,894,959 B2
(45) Date of Patent: Nov. 25, 2014

(54) SILICON PRODUCTION METHOD

(75) Inventors: Satoru Wakamatsu, Shunan (JP); Hiroyuki Oda, Shunan (JP)

(73) Assignee: Tokuyama Corporation, Shunan-Shi (JP)

(*) Notice: Subject to any disclaimer, the term of this patent is extended or adjusted under 35 U.S.C. 154(b) by 942 days.

(21) Appl. No.: 11/920,418

(22) PCT Filed: May 15, 2006

(86) PCT No.: PCT/JP2006/310081
§ 371 (c)(1),
(2), (4) Date: Nov. 15, 2007

(87) PCT Pub. No.: WO2006/123802
PCT Pub. Date: Nov. 23, 2006

(65) Prior Publication Data
US 2009/0098039 A1    Apr. 16, 2009

(30) Foreign Application Priority Data
May 18, 2005 (JP) .................. 2005-145090

(51) Int. Cl.
*C01B 33/03* (2006.01)
*C01B 33/107* (2006.01)
*H01L 31/18* (2006.01)
*C01B 33/035* (2006.01)

(52) U.S. Cl.
CPC ...... *H01L 31/1804* (2013.01); *C01B 33/10773* (2013.01); *Y02E 10/547* (2013.01); *C01B 33/03* (2013.01); *C01B 33/035* (2013.01)
USPC .............. 423/350; 423/348; 423/349; 75/585

(58) Field of Classification Search
USPC .............. 423/348, 350, 349; 75/585
See application file for complete search history.

(56) References Cited

U.S. PATENT DOCUMENTS

| | | |
|---|---|---|
| 3,147,071 A | 9/1964 | Jenkner |
| 4,113,845 A | 9/1978 | Litteral |
| 4,892,568 A | 1/1990 | Prigge et al. |
| 5,118,485 A | 6/1992 | Arvidson et al. |
| 6,060,021 A | 5/2000 | Oda et al. |
| 2004/0052716 A1 | 3/2004 | Wakamatsu et al. |

FOREIGN PATENT DOCUMENTS

| | | |
|---|---|---|
| JP | 52-18678 B2 | 5/1977 |
| JP | 52-18678 B4 | 5/1977 |
| JP | 1-283817 A | 11/1989 |
| JP | 2-6318 A | 1/1990 |
| JP | 10-316413 A | 12/1998 |
| JP | 11-20895 A | 1/1999 |
| JP | 2004-2138 A | 1/2004 |

OTHER PUBLICATIONS

A. Goetzberger et al., "Photbvoltaic materials, history, status and outlook", Materials Science and Engineering: Reports: A Review Journal, vol. 40, No. 1, Jan. 1, 2003, pp. 1-46, XP004396100; ISSN: 0927-0796X.
Communication from European Patent Office, issued on Nov. 23, 2009 for App. No. 067 32 655.

*Primary Examiner* — Rebecca Lee
(74) *Attorney, Agent, or Firm* — Birch, Stewart, Kolasch & Birch, LLP

(57) ABSTRACT

There is provided a silicon production method which comprises producing semiconductor grade silicon while producing solar grade silicon by converting a portion of trichlorosilane into silicon for solar cells.
There is also provided an industrially advantageous method that removes contaminants from a chlorosilane circulating system which produces trichlorosilane in producing silicon from trichlorosilane by a vapor deposition method.

3 Claims, 1 Drawing Sheet

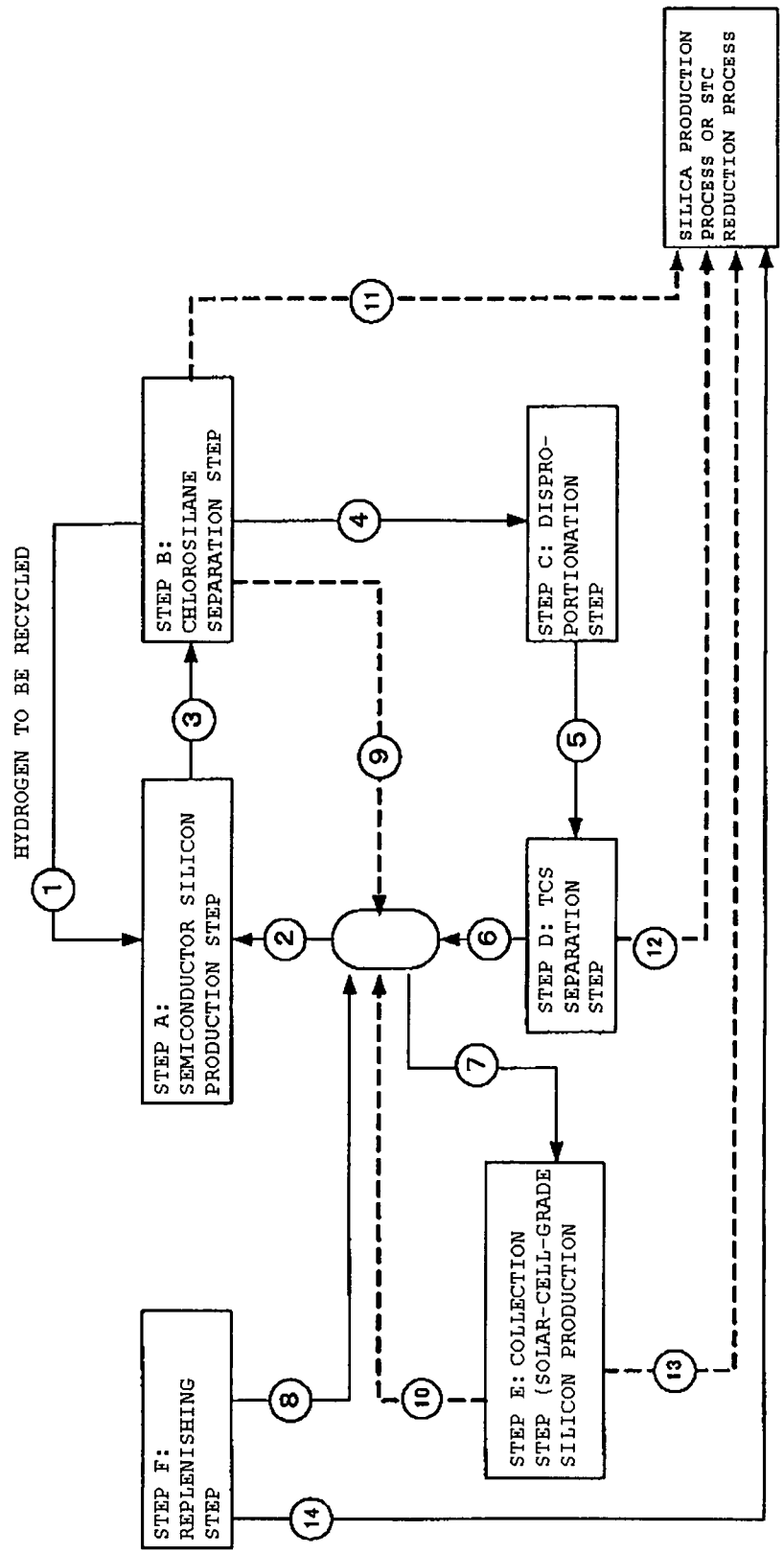

SILICON PRODUCTION METHOD

TECHNICAL FIELD

The present invention relates to a silicon production method. More specifically, the present invention relates to a silicon production method comprising producing solar grade silicon from a portion of trichlorosilane in a chlorosilane circulating system in producing semiconductor grade silicon from trichlorosilane so as to discharge contaminants present in the chlorosilane circulating system from the circulating system and thereby producing high-purity semiconductor grade silicon continuously.

BACKGROUND ART

Production of semiconductor grade silicon by a chemical vapor deposition process (CVD process) has already been technically known.

Chemistry of disproportionation reaction of silicon-containing material having hydrogen and chlorine in a molecule has already been technically known. Use of a solid catalyst or a catalyst on a solid substrate has also been technically known. The specification of U.S. Pat. No. 3,147,071 discloses a method of producing dichlorosilane from silane or a reaction mixture such as tetrachlorosilane by use of activated carbon as a catalyst. The specification of U.S. Pat. No. 4,113,845 discloses a method which can prepare dichlorosilane from trichlorosilane and prepare silane from dichlorosilane. This method uses an ion exchange resin having a tertiary amino or quaternary ammonium group bonded thereto as a catalyst. Japanese Patent Laid-Open Publication No. 1-283817 discloses a method of increasing trichlorosilane by mixing tetrachlorosilane with dichlorosilane discharged from a semiconductor grade silicon deposition reactor and subjecting the mixture to a disproportionation reaction catalyst. The nature of this invention is to increase trichlorosilane. However, this method has a problem that the purity of semiconductor grade silicon produced is gradually deteriorated when the method is carried out.

DISCLOSURE OF THE INVENTION

An object of the present invention is to provide a silicon deposition method which makes it possible to produce semiconductor grade silicon continuously by producing solar grade silicon from a portion of trichlorosilane in a chlorosilane circulating system in producing semiconductor grade silicon from trichlorosilane and thereby discharging contaminants present in the chlorosilane circulating system from the circulating system.

Another object of the present invention is to provide a silicon deposition method which achieves the above object while minimizing the loss of low-boiling-point silane.

Other objects and advantages of the present invention will become apparent from the following description.

According to the present invention, the above objects and advantages of the present invention are achieved by a silicon production method comprising:

a semiconductor grade silicon production step (step A) of producing semiconductor grade silicon on a heated substrate by feeding trichlorosilane vapor together with hydrogen gas into a deposition reactor having the heated substrate, a chlorosilane separation step (step B) of separating hydrogen and a chlorosilane from gas discharged from the step A, a disproportionation step (step C) of passing a mixture comprising a low-boiling-point silane component and tetrachlorosilane which is obtained in the step B through a chlorosilane disproportionation solid catalyst bed to produce a mixture having an increased proportion of trichlorosilane, a trichlorosilane separation step (step D) of obtaining trichlorosilane by distilling and purifying the mixture obtained in the step C and having an increased proportion of trichlorosilane, and a collection step (step E) of converting a portion of trichlorosilane obtained in the step D into solar grade silicon and collecting it.

The term "chlorosilane" in the present specification refers to a silicon compound having a chlorine atom in the molecule, as typified by monochlorosilane ($SiH_3Cl$ or MCS), dichlorosilane ($SiH_2Cl_2$ or DCS), trichlorosilane ($SiHCl_3$ or TCS) and tetrachlorosilane ($SiCl_4$ or STC). In the present invention, a "low-boiling-point silane" is defined as silane ($SiH_4$), MCS and DCS.

TCS obtained by distilling and purifying a condensate of gas discharged from a semiconductor grade silicon deposition reaction has high purity, and even if the TCS is continuously circulated to the semiconductor grade silicon deposition reaction, the purity of silicon produced is kept high without any problems.

However, the present inventors have found that when a process comprising mixing a low-boiling-point silane mixture composed essentially of dichlorosilane which is contained in the above discharged gas with STC or the like and subjecting the resulting mixture to a disproportionation reaction to increase TCS is inserted into the above circulating system, TCS obtained thereby contain impurities which cannot be removed completely even by purification and distillation, and the impurities are accumulated while the operation is continued and eventually degrade the quality of silicon produced to such a level that it is not appropriate semiconductor grade silicon.

As a result of making intensive studies, the present inventors have found that a phosphorus-containing impurity having a boiling point close to that of DSC is contained in the gas discharged from the silicon deposition reaction and that the phosphorus-containing impurity is converted into an impurity having a boiling point close to that of TCS by the disproportionation reaction and causes degradation in the purity of silicon.

The quantity of this phosphorus-containing impurity can be determined by accurate chemical analysis. However, since it exists in a very small amount, it has never been isolated from other chlorosilanes. Therefore, its accurate molecular formula and boiling point have not been found.

The present inventors assume that this phosphorus-containing impurity is silyl phosphine ($SiH_3PH_2$, estimated boiling point: 8 to 12° C.), as a result of take into account such points that it should be a material having an Si—H bond in the molecule and that it has a boiling point close to that of DCS, based on a phenomenon that the impurity undergoes the disproportionation reaction with the chlorosilane rich in an Si—Cl bond and changes into a high-boiling-point material.

That is, in consideration of the chemical reaction formulae of the disproportionation reaction, it is assumed that DCS is converted into TCS in the following reaction formula (1) and that silyl phosphine having a boiling point close to that of DCS is converted into chlorosilyl phosphine in the following reaction formula (2).

$$SiH_2Cl_2 + SiCl_4 \rightarrow 2SiHCl_3 \qquad (1)$$

$$SiH_3PH_2 + SiCl_4 \rightarrow SiH_2ClPH_2 + SiHCl_3 \qquad (2)$$

This assumption is considered to be appropriate in consideration of chemical analysis of chlorosilane before and after the disproportionation reaction and conversion behavior of the impurities in the disproportionation reaction.

The present inventors have carefully examined the behavior of silyl phosphine in the silicon deposition reaction by accurate chemical analysis. As a result, they have found that in a conventional semiconductor grade silicon deposition reaction, a probability that a phosphorus-containing impurity assumed to be chlorosilyl phosphine is taken into a deposit together with silicon is merely about 20% per passage through a silicon deposition reactor.

That is, the present inventors have understood a mechanism that although the influence of chlorosilyl phosphine produced by a disproportionation reaction is hardly seen in a short-term operation, chlorosilyl phosphine is concentrated and accumulated in a long-term, continuous operation, resulting in silicon that fails to satisfy the quality of semiconductor grade silicon.

In view of the above mechanism that the quality of silicon is degraded when DCS in gas discharged from a semiconductor grade silicon deposition reaction is subjected to a disproportionation reaction, the present inventors have made further studies and studied a method of retaining the quality of semiconductor grade silicon while collecting DCS as useful TCS.

As a result, the present inventors have found that by raising the temperature of the gas to 500° C. or higher, decomposition of the above chlorosilyl phosphine is promoted, and a probability that a phosphorus component is taken into silicon is improved or it is converted into another material which is easily separated from TCS by distillation.

In the case of a conventional silicon deposition reactor called a bell jar, it is difficult to raise the temperature of reaction gas to a sufficient level, and a probability that a phosphorus component is taken into silicon is small. However, it has been revealed that by use of a silicon deposition reactor as a type of using a fluidized bed having a particle temperature of 600° C. or higher or a deposition reactor in which silicon is deposited in a carbon tube heated to 1,200° C. or higher, the temperature of reaction gas can be raised to 500° C. or higher and chlorosilyl phosphine can be removed effectively. At the same time, the present inventors have confirmed that although silicon produced by these silicon deposition reactors is not acceptable for a semiconductor grade silicon, it has a sufficient quality that it can be used as solar grade silicon. Thereby, the present inventors have completed the present invention.

BRIEF DESCRIPTION OF THE DRAWINGS

FIG. 1 is a diagram for illustrating the process flow of the present invention.

BEST MODE FOR CARRYING OUT THE INVENTION

To carry out the above steps A and B, an apparatus and a method which are similar to those described in the above semiconductor grade silicon production technique using CVD are used. Hereinafter, the present invention will be described by use of a process flow illustrated in FIG. 1 which is a typical embodiment.

The step A in the present invention is a semiconductor grade silicon production step using a semiconductor grade silicon deposition reactor. Typically, it is a so-called Siemens method comprising feeding a mixed gas of hydrogen (1) and TCS (2) on a pure silicon substrate heated to at least about 900° C. to deposit new silicon on the silicon substrate. In this step A, hydrogen chloride, MCS, DCS and STC are produced as by-products, and these by-products, together with excessive hydrogen and unreacted TCS, are discharged from the step A as a gas flow (3).

The step B is a chlorosilane separation step of separating hydrogen and a chlorosilane from the gas discharged from the step A. As methods used in this step B, a known cold condensation method and adsorption method are suitably used.

In this step B, a gas compressor is particularly preferably disposed in the upstream of condenser so as to improve the efficiency of condensation. Although the condenser may be disposed only in the downstream of the compressor, an additional condenser may be disposed in the upstream of the compressor, when the concentration of chlorosilane in the gas discharged from the step A is high and condensation in the compressor is undesirable. The both condensers may be constituted by a plurality of heat exchangers for effective use of cooling energy.

In the step B, a condensate is particularly preferably separated into flows composed essentially of a low-boiling-point silane, TCS and STC, respectively, so as to promote the disproportionation reaction in the next step C and reduce a load on separation by distillation in the subsequent step D. That is, since TCS separated at this point is high-purity TCS containing no impurities, it can be fed back to the silicon deposition reaction in the step A through a line (9), although it is not necessary condition. Further, use of a mixture of a low-boiling-point silane and STC from which a large proportion of TCS has been removed has advantages that a large-sized reactor is not required in the step C and that the disproportionation reaction which is an equilibrium reaction can be promoted to the TCS side advantageously.

As a method of separating the condensate in the step B into flows composed essentially of a low-boiling-point silane, TCS and STC as described above, it is possible to use a known distillation column or a so-called partial condensation technique comprising condensing liquids having different boiling points by adjusting the temperature and pressure of condensation which is carried out in multiple stages as appropriate.

The step C is a step of collecting the low-boiling-point silane contained in the gas (3) discharged from the step A as useful TCS. This is achieved by passing a mixture (4) of a low-boiling-point silane and a chlorosilane rich in chlorine which is obtained in the above step B through a disproportionation solid catalyst bed of chlorosilane.

To be more specific, the chlorosilane rich in chlorine is a chlorosilane composed essentially of STC and can be selected from STC separated in the step B, another STC which is prepared separately and a mixture of these STCs.

To convert the low-boiling-point silane into TCS efficiently in the step C, the composition of the material to be fed to the step C is preferably so adjusted to be richer in chlorine to promote the equilibrium reaction to the production system side, i.e. the TCS side.

The disproportionation reaction in the step C is carried out by passing liquid or vapor flow through a solid catalyst, i.e. a catalyst bed which is effective for a disproportionation reaction of silane containing hydrogen and silane containing chlorine. A number of catalysts for a disproportionation reaction are available and technically widely known. A suitable catalyst is selected from the group consisting of activated carbon, a nitrogen-containing material on a solid substrate and a phosphorus-containing material on a solid substrate. Illustrative examples of the nitrogen-containing material include halogenated quaternary ammonium, tertiary amine, dialkyl cyanamide, and nitrile. Illustrative examples of the phosphorus-containing material include halogenated quaternary phosphonium and phosphoramide. A more desirable catalyst is an organic resin, e.g. a nitrogen compound on a styrene-divinylbenzene polymer matrix.

Promotion of the disproportionation reaction of chlorosilane is carried out primarily by controlling the temperature in the catalyst bed and the residence time or contact time of the reactant. The temperature in the catalyst bed is desirably kept at about 10 to 80° C. from the viewpoint of activity and suppression of other impurities from the catalyst. The residence time is desirably about 5 to 20 minutes when represented by dividing the volume of the catalyst filled layer by the volume flow of the reactant. A residence time of 20 minutes or longer increases equipment costs.

It is assumed that even in the case of a gas phase system at the above temperature, a residence time of about 1 second or longer leads to appropriate disproportionation of speed. The contact time is desirably about 1 to 10 seconds so as to make the composition of the reactant closer to an equilibrium state. A contact time of 10 seconds or longer increases equipment costs.

Although not shown in the FIGURE, the discharged gas resulting from removing the chlorosilane can be sent to a step of separating the remaining hydrogen chloride from hydrogen so as to eventually collect hydrogen. As a method of separating hydrogen from trace amounts of chlorosilane and hydrogen chloride, a known method such as activated carbon can be used. Another known method is a method comprising rinsing the gas flow with water and drying separated hydrogen. Although the isolated hydrogen flow may contain a trace amount of hydrogen chloride, the thus collected hydrogen (1) is suited to be recycled in the step A.

The hydrogen (1) may be purged from the system in some cases so as to reduce the concentration of impurities such as methane. In these cases, although not shown in the FIGURE, separately prepared hydrogen may be added to the hydrogen (1).

The step D is a step of effectively separating a chlorosilane mixture (5) having an increased proportion of TCS which has been produced in the step C by a known method such as distillation. A large proportion of TCS separated by distillation in the step D can be returned to the step A via the line (6) to be recycled as a deposition raw material of semiconductor grade silicon.

The step E is a step of extracting a portion of TCS contaminated in the step C from the semiconductor grade silicon production process through the line (7) converting the extracted TCS into solar grade silicon and collecting it as a useful material so as to maintain the purity of semiconductor grade silicon.

To retain the purity of semiconductor grade silicon, a deposition method in which impurities are more liable to be taken into silicon than a conventional semiconductor grade silicon deposition reaction needs to be used in the step E. It has already been described about this deposition method that the temperature of gas in the deposition reaction must be raised to 500° C. or higher. Illustrative examples of this method include a fluidized-bed-type silicon deposition reactor with a particle temperature of 600° C. or higher, and a deposition reactor of a type which passes a mixed gas of hydrogen and TCS through a carbon tube heated to at least 1,200° C. to deposit silicon on the internal surface of the tube. In particular, the latter can remove impurities more effectively because it has a high deposition surface temperature and can also raise the temperature of the gas to a sufficient level. In the step E, it is not excluded to use a reactor according to a Siemens method which has a thermal insulation material therein to increase the temperature of the gas to a sufficient level.

In the step E, more impurities are contained in silicon produced by use of the above silicon deposition method than semiconductor grade silicon. However, the impurities are contained in such an amount that is allowable without any problems as solar grade silicon.

Although not shown in the FIGURE, the same process as used in the above step B is also used in the step E to separate hydrogen and the chlorosilane, and hydrogen is preferably recirculated in the step E. Meanwhile, since the concentration of chlorosilyl phosphine in the separated chlorosilane is low, TCS can be separated by distillation and reused in the step E, and separated TCS can be returned to the step A via a line (10). Further, although not shown in the FIGURE, a low-boiling-point silane by-produced in the step E can be subjected to the disproportionation reaction in the step C.

The step F is a replenishing step of replenishing a chlorosilane. Since silicon is produced in the steps A and E, a silicon element is gradually decreased in the system. To replenish the silicon element and continue a production operation industrially, the silicon element must be fed into the system. The silicon element is preferably fed into the system in the form of a chlorosilane, particularly TCS. As a method of producing TCS, a method of reacting metallurgical silicon with hydrogen chloride or a method of reacting metallurgical silicon with hydrogen and silicon tetrachloride can be suitably used.

The thus produced chlorosilane prepared separately can be fed to any one or more points in the process represented by the steps A to E. The most preferred embodiment is a method comprising purifying separately prepared TCS by distillation to high purity and feeding it into the system in the form of being mixed with TCS to be fed to the step A as shown by (8) in FIG. 1.

Although STC is separated in the steps B, D, E and F, these STCs can be sent to the silica production process or the STC reduction process as indicated by STC (11), (12), (13) and (14), respectively. In the STC reduction process, a method of reacting STC with metallurgical silicon and hydrogen or a method of reacting STC with hydrogen is typically used. Although not shown in the FIGURE, TCS and a low-boiling-point silane obtained by reducing STC can be returned to respective proper positions in the semiconductor or solar grade silicon production step as separately prepared chlorosilane. Thus, the STC reduction process can be regarded as one measure for the step F in the present invention.

As described above, the present invention makes it possible to discharge contaminants present in a chlorosilane circulating system from the circulating system by producing solar grade silicon from a portion of trichlorosilane and thereby produce semiconductor grade silicon continuously.

EXAMPLE

Hereinafter, the present invention will be further described with reference to examples. The present invention shall not be limited by these examples in any way.

Example 1

A typical flow will be described by use of FIG. 1 which is an attached drawing for illustrating the process flow.

Crude TCS obtained by reacting metallurgical silicon with hydrogen chloride was distilled and purified and sent to a TCS storage tank as liquid (8) to be supplied to the step A. A portion of STC by-produced in the step F was sent to a silica production process through a line (14), and its remaining portion was sent to an STC reduction process. In the silica production process, a humed silica production method of burning and decomposing STC in hydrogen flame was employed.

Hydrogen (1) and high-purity trichlorosilane (2) were sent to a silicon deposition reactor (step A) according to a Siemens method. In this silicon deposition reactor, semiconductor grade silicon showing a specific resistance of not lower than 1,000 Ωcm was produced.

A gas flow (3) discharged from the silicon deposition reactor (step A) was cold-condensed by condensers disposed in the upstream and downstream of compressor in the step B. Thereby, a large proportion of chlorosilane was liquefied and collected. A chlorosilane and hydrogen chloride which remained in hydrogen in trace amounts were completely removed by an activated carbon adsorption column, and hydrogen was returned to the step A ((1)).

The above condensate was separated into flows composed essentially of a low-boiling-point silane, TCS and STC by a distillation column, and TCS was returned to the step A ((9)).

The low-boiling-point silane solution separated in the step B was mixed with the STC solution and fed to the disproportionation reaction step (step C) ((4)). As a disproportionation catalyst, a weakly basic anion exchange resin having a dimethylamine functional group was used. The mixed solution was allowed to react at a temperature of 80° C. and a pressure of 190 kPaG for 20 minutes. The compositions of inlet and outlet in the step C are as shown in Table 1.

TABLE 1

|  | Composition (kg) | |
|---|---|---|
|  | Inlet (4) | Outlet (5) |
| Dichlorosilane | 1.2 | 0 |
| Trichlorosilane | 2.1 | 5.3 |
| Silicon Tetrachloride | 18.4 | 16.4 |

It can be seen that nearly all of DCS was converted into TCS by the disproportionation reaction. It is assumed that probably during this process, silyl phosphine close to the boiling point of DCS was also converted into chlorosilyl phosphine close to the boiling point of TCS.

Liquid (5) discharged from the disproportionation reaction is separated into TCS and STC by distillation, and a large proportion of TCS was sent to the TCS storage tank through a line (6) so as to be returned to the step A. Meanwhile, STC was taken out through an STC line (12), a portion thereof was sent to the humed silica production process, and the remaining portion thereof was sent to the STC reduction process.

In order not to affect the quality of semiconductor grade silicon, a portion of TCS in which an impurity assumed to be chlorosilyl phosphine was mixed was taken out from the TCS storage tank through a line (7) and fed to a melt deposition reactor (step E). In this melt deposition reactor, hydrogen and TCS were fed in a carbon tube heated to 1,450° C. so as to produce solar grade silicon. In this case, the reaction gas temperature was about 1,000° C.

Gas discharged from the melt deposition reactor was cold-condensed so as to be separated into hydrogen and a chlorosilane. Hydrogen was circulated in the melt deposition reactor. The condensed liquid chlorosilane was distilled, TCS was recycled in the step E, and STC was fed to the silica production process and the STC reduction process.

The system was continuously run for 72 hours with a TCS feed ratio in the lines (2) and (7) of 10:1. The average specific resistance of silicon obtained in the semiconductor grade silicon deposition reactor at that time was 2,500 Ωcm. Meanwhile, the specific resistance of solar grade silicon obtained in the melt deposition reactor was 80 Ωcm.

As described above, the phosphorus-containing impurity assumed to be chlorosilyl phosphine could be decreased by feeding a portion of TCS subjected to the disproportionation reaction and contaminated to the melt deposition reactor. However, the effect was too great as an effect for when the impurity was mixed in the solar grade silicon. It is assumed that STC was discharged from the system through the line (12) because the temperature of the gas in the melt deposition reactor exceeded 800° C., bonds such as Si—H, Si—Cl and P—H of chlorosilyl phosphine were cut and silyl phosphine was further chlorinated or changed into another high-boiling-point phosphorus compound.

Meanwhile, in the semiconductor grade silicon deposition reactor (Bell-jar-type reactor having a shell formed by a cooling jacket), it was assumed that chlorosilyl phosphine was not decomposed easily because the average temperature of gas was merely 200° C.

Comparative Example 1

When extraction of TCS through the line (7) was stopped and only the semiconductor grade silicon deposition system was operated, specific resistance started to be lowered from passage of about 12 hours, and the specific resistance of deposited silicon became 500 Ωcm or lower after about 48 hours and the quality as a semiconductor grade was not maintained. As a result of measuring the purity of trichlorosilane by an accurate chemical analysis method, a qualitative analysis could not be made, but it was found that the concentration of phosphorus became as high as about 1 ppba.

The invention claimed is:

1. A silicon production method comprising:
   a semiconductor grade silicon production step (step A) of producing semiconductor grade silicon on a heated substrate by feeding trichlorosilane vapor together with hydrogen gas into a deposition reactor having the heated substrate,
   a chlorosilane separation step (step B) of separating hydrogen and a chlorosilane from gas discharged from the step A,
   a disproportionation step (step C) of passing a mixture comprising a low-boiling-point silane component and tetrachlorosilane which is obtained in the step B through a chlorosilane disproportionation solid catalyst bed to produce a mixture having an increased proportion of trichlorosilane,
   a trichlorosilane separation step (step D) of obtaining trichlorosilane by distilling and purifying the mixture obtained in the step C,
   a collection step (step (E(i))) which comprises mixing a stream of the trichlorosilane obtained in step D, which contains chlorosilyl phosphine impurities, with hydrogen, decomposing said impurities by raising the average temperature of a reaction gas to over 800° C., depositing solar grade silicon, and collecting the solar grade silicon,
   a recycling step (step (E(ii))) which comprises recycling a separate stream of trichlorosilane obtained in step D, which is different from the stream used in step E(i), back to step A, and
   a replenishing step (step F) of replenishing a separately prepared chlorosilane to any of the steps A to E(i).

2. The method of claim 1, wherein the average temperature of the reaction gas is raised to 500° C. or higher by feeding trichlorosilane and hydrogen to a silicon fluidized layer having a particle temperature of 600° C. or higher.

3. The method of claim 1, wherein the average temperature of the reaction gas is raised to 500° C. or higher by feeding trichlorosilane and hydrogen to a reactor comprising a carbon tube heated to 1200° C. or higher.

\* \* \* \* \*